(12) United States Patent
Akbarinia et al.

(10) Patent No.: US 10,466,598 B2
(45) Date of Patent: Nov. 5, 2019

(54) PROJECTION EXPOSURE APPARATUS FOR SEMICONDUCTOR LITHOGRAPHY WITH INCREASED THERMAL ROBUSTNESS

(71) Applicant: Carl Zeiss SMT GmbH, Oberkochen (DE)

(72) Inventors: Alireza Akbarinia, Heidenheim (DE); Alexandre Kemp, Ludwigshafen am Rhein (DE); Timo Laufer, Stuttgart (DE); Amishkumar Panchal, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/368,467

(22) Filed: Mar. 28, 2019

(65) Prior Publication Data

US 2019/0219934 A1 Jul. 18, 2019

Related U.S. Application Data

(63) Continuation of application No. PCT/EP2017/074431, filed on Sep. 27, 2017.

(30) Foreign Application Priority Data

Oct. 6, 2016 (DE) .......................... 10 2016 219 333

(51) Int. Cl.
*G03F 7/20* (2006.01)
(52) U.S. Cl.
CPC .......... *G03F 7/70775* (2013.01); *G03F 7/708* (2013.01); *G03F 7/709* (2013.01);
(Continued)
(58) Field of Classification Search
CPC .... G03F 7/709; G03F 7/70891; G03F 7/7095; G03F 7/70858; G03F 7/70833;
(Continued)

(56) References Cited

U.S. PATENT DOCUMENTS

2003/0010902 A1 1/2003 Hof et al.
2004/0227107 A1 11/2004 Cox et al.
(Continued)

FOREIGN PATENT DOCUMENTS

DE 101 34 387 A1 1/2003
DE 10 2009 034 166 A1 2/2010
(Continued)

OTHER PUBLICATIONS

International Search Report and Written Opinion for corresponding PCT Appl No. PCT/EP2017/074431, dated Jan. 5, 2018.
(Continued)

*Primary Examiner* — Michelle M Iacoletti
(74) *Attorney, Agent, or Firm* — Fish & Richardson P.C.

(57) ABSTRACT

A projection exposure apparatus for semiconductor lithography includes: a light source for generating optical used radiation by which structures arranged on a reticle can be imaged onto a wafer; a plurality of optical elements for guiding and manipulating the used radiation; and a plurality of position sensors for determining the position of at least some of the optical elements. At least some of the position sensors are arranged on a measurement structure that is at least partially decoupled mechanically and/or thermally from the further components of the projection exposure apparatus. The measurement structure has at least two mechanically decoupled substructures. The first substructure has a lower coefficient of thermal expansion than the second substructure. The second substructure has a greater stiffness than the first substructure.

20 Claims, 2 Drawing Sheets

(52) U.S. Cl.
CPC ........ *G03F 7/7095* (2013.01); *G03F 7/70766* (2013.01); *G03F 7/70825* (2013.01); *G03F 7/70833* (2013.01); *G03F 7/70858* (2013.01); *G03F 7/70891* (2013.01)

(58) Field of Classification Search
CPC .. G03F 7/70825; G03F 7/708; G03F 7/70766; G03F 7/70775
See application file for complete search history.

(56) References Cited

U.S. PATENT DOCUMENTS

| | | |
|---|---|---|
| 2011/0170078 A1 | 7/2011 | Loopstra et al. |
| 2011/0194091 A1 | 8/2011 | Kwan et al. |
| 2015/0062596 A1 | 3/2015 | Kwan et al. |

FOREIGN PATENT DOCUMENTS

| | | |
|---|---|---|
| EP | 1 513 021 A1 | 3/2005 |
| WO | WO 2016/139012 | 9/2016 |

OTHER PUBLICATIONS

German Office Action, with translation thereof, for corresponding DE Appl No. 10 2016 219 333.3, dated Jun. 20, 2017.

PROJECTION EXPOSURE APPARATUS FOR SEMICONDUCTOR LITHOGRAPHY WITH INCREASED THERMAL ROBUSTNESS

CROSS-REFERENCE TO RELATED APPLICATIONS

The present application is a continuation of, and claims benefit under 35 USC 120 to, international application PCT/EP2017/074431, filed Sep. 27, 2017, which claims benefit under 35 USC 119 of German Application No. 10 2016 219 333.3, filed Oct. 6, 2016. The entire disclosure of these applications are incorporated by reference herein.

FIELD

The disclosure relates to a projection exposure apparatus for semiconductor lithography, in particular an EUV projection exposure apparatus. Such apparatuses are used for producing fine structures, in particular on semiconductor devices or other microstructured components. The operating principle of the apparatuses is based on the production of finest structures up to the nanometer range by way of generally reducing imaging of structures on a mask, also referred to as a reticle, on an element to be structured that is provided with photosensitive material, and by way of subsequent further process steps. The minimum dimensions of the structures produced here are directly dependent on the wavelength of the light used. Recently, light sources having an emission wavelength in the range of a few nanometers, for example in the range between 1 nm and 30 nm, in particular in the range of 13.5 nm, have been increasingly used. The described wavelength range is also referred to as the EUV range.

BACKGROUND

The optical components used for imaging for the above-described application are positioned with the greatest precision in order to be able to ensure sufficient imaging quality. To this end, for example, German patent application DE 10 2009 034 166 A1 proposes the use of a measurement structure that is largely mechanically decoupled from the remaining system components for the precise position determination of the optical elements used for imaging in a projection lens. This structure here supports merely itself and sensors, in particular position sensors in the form of optical encoders. The measurement structure is sometimes also referred to in literature as a "sensor frame." However, the measurement structure is partially subject to competing demands. To reduce oscillations of the measurement structure in the case of externally induced oscillations and thus dynamic control of the oscillations from being made impossible, the measurement structure has a comparatively stiff design, in other words high natural frequencies. This increases the accuracy of the measurement. Moreover, the measurement structure should also have a low coefficient of thermal expansion in order to keep positioning errors due to thermal drift low and have a low magnetostrictive constant to keep magnetostriction as low as possible—this serves repetition precision. In the past, suggestions have been made for this reason to form the measurement structure at least partially from a ceramic, in particular SiSiC. The material was considered to be the best possible compromise to meet the complex demands to the greatest possible extent. However, a disadvantage here is that SiSiC is difficult to machine mechanically and has a coefficient of thermal expansion that generally involves cooling of the measurement structure.

SUMMARY

The disclosure seeks to provide a projection exposure apparatus that has increased robustness to thermal influences and, if possible, also magnetic influences as regards positioning of the optical elements.

In a general aspect, the disclosure provides a projection exposure apparatus for semiconductor lithography, which includes: a light source for generating optical used radiation by way of which structures, which are arranged on a reticle, can be imaged onto a wafer; a plurality of optical elements for guiding and manipulating the used radiation; and a plurality of position sensors for determining the position of at least some of the optical elements. At least some of the position sensors are arranged on a measurement structure that is at least partially decoupled mechanically and/or thermally from the further components of the projection exposure apparatus. The measurement structure has at least two substructures that are mechanically decoupled from one another, of which: the first substructure has a lower coefficient of thermal expansion than the second substructure; and the second substructure has a higher stiffness than the first sub-structure.

A projection exposure apparatus for semiconductor lithography in accordance with the disclosure includes a light source for producing optical used radiation, by of which structures, which are arranged on a reticle, can be imaged onto a wafer, and a plurality of optical elements for guiding and manipulating the used radiation. The projection exposure apparatus in accordance with the disclosure furthermore includes a plurality of position sensors for determining the position of at least some of the optical elements. At least some of the position sensors are arranged here on a measurement structure that is at least partially decoupled mechanically and/or thermally from the further components of the projection exposure apparatus. In accordance with the disclosure, the measurement structure has at least two mechanically decoupled substructures, the first of which has a lower coefficient of thermal expansion than the second one, and the second one has a greater stiffness than the first one.

The first substructure is largely insensitive to temperature fluctuations owing to its low coefficient of thermal expansion. In other words, temperature fluctuations in this substructure do not result in measurement errors, or only to a very small extent. The first substructure is thus particularly suitable for determining a position of an optical component on a long timescale with high repetition precision. Since the first substructure is optimized with regard to a minimum linear thermal change, it should be expected due to the lower stiffness, which is consequently practically inevitable, that it has lower natural frequencies than the second, stiffer substructure. This property of the first structure, however, can be tolerated in view of its task, specifically position determination on a comparatively long timescale.

In contrast, the second substructure is optimized with regards to high natural frequencies and thus high stiffness. It serves for detecting quick position changes of the measured optical elements which can be caused, for example, by oscillations of the system; such position changes, however, typically take place on far shorter timescales than thermally induced deviations.

For an optimized position determination of the optical elements, an evaluation unit will consequently perform a weighting of the signals coming from the sensors that are arranged on the different substructures in a manner such that high-frequency signals are weighted higher by the sensors that are arranged on the second substructure than lows frequency signals of the sensors that are arranged on the structure. Conversely, low-frequency signals of those sensors that are arranged on the first substructure are weighted higher than higher-frequency signals.

The robustness of the system thus achieved with respect to thermal influences offers a number of advantages. For example, it is possible to dispense with the use of ceramics which are comparatively difficult to machine, such as SiSiC, because a compromise between a high natural frequency and a low coefficient of thermal expansion is no longer necessary. In particular, complex measures for thermal management, in particular for cooling, can also be dispensed with, as a result of which additional installation space becomes available and new structural possibilities are unlocked; moreover, mechanical disturbances due to flowing cooling fluids no longer occur or are reduced.

Due to the fact that, as is customary in the prior art, temperatures need not be measured and a mechanical response of the system does not need to be calculated from more or less simplifying or inaccurate mechanical models of the components involved, but rather that the real conditions in the system are determined directly, it is possible for the repetition precision of the projection exposure apparatus in particular also during the positioning of the wafer between the exposure steps to be significantly increased, which ultimately leads to a significant reduction in what are known as overlay errors.

In addition, it is possible for the first substructure to have a lower magnetostrictive constant than the second substructure. In this way, magnetic influences on the geometry of the first substructure can be reduced, which ultimately leads to a further improvement of the repetition precision of the projection exposure apparatus.

In an advantageous variant of the disclosure, the first substructure can be formed at least sectionally from Zerodur, as a result of which a markedly high robustness of this sub-structure with regard to thermal influences is achieved.

The second substructure can be formed at least sectionally from aluminum or stainless steel. Structures having high natural stiffness can be produced from both materials; in addition, the materials are available for a multiplicity of production methods that are perfectly managed in production-technological terms, for example cutting methods.

In an advantageous embodiment of the disclosure, the positions of reference points on one of the two substructures can be determined using sensors that are arranged on the other substructure. By way of example, the sensors can be arranged on the first substructure and determine the thermal or magnetostrictive expansion of the second substructure. In this case, the second substructure can have further position sensors that can be used to determine the position of reference points on an optical element to be measured. It is then possible, on the basis of the now more accurate knowledge of the current shape or expansion of the second substructure, to ultimately achieve a significantly more precise position determination of the optical element.

Alternatively or additionally, sensors that are arranged on both substructures can be used to determine the positions of reference points on at least one component of the projection exposure apparatus, in particular on at least one optical element. In this case, the sensors of the first substructure provide a relatively reliable statement relating to the position of the optical element on a long timescale. The sensors of the second substructure can, due to the high natural stiffness of the second substructure, detect higher-frequency oscillations more reliably and thus contribute to effective oscillation decoupling or control of oscillations of the system.

In an advantageous variant of the disclosure, the two substructures have in each case three to five segments, to which in each case 5-15 measurement points are assigned. In order to have a greater selection of measurement points available, it is possible for a plurality of sensors, in particular analogously to the measurement point number, between 5 and 15 sensors, to be provided. In this way, the position or the orientation of the optical elements can be determined with all involved degrees of freedom. In particular, the substructures can also include a plurality of segments that are mechanically decoupled from one another.

The light source of the projection exposure apparatus can be set up in particular to emit EUV radiation.

The two substructures can advantageously be arranged on a common frame. Suitable herefor in particular is what is known as the metro frame that is typically used for EUV projection exposure apparatuses. The metro frame is an oscillation-isolated frame on which the scanner table of the projection exposure apparatus is also located.

The described measures in accordance with the disclosure do not necessarily need to be applied to a complete measurement structure of a projection exposure apparatus. It can also suffice to apply the described division into substructures having different thermal or mechanical properties to parts of a measurement structure. In particular, optically particularly sensitive and thermally highly loaded regions of the measurement structure are suitable here.

BRIEF DESCRIPTION OF THE DRAWINGS

Exemplary embodiments and variants of the disclosure will be explained in more detail below with reference to the drawings, in which.

DESCRIPTION OF EXEMPLARY EMBODIMENTS

Figure 1:
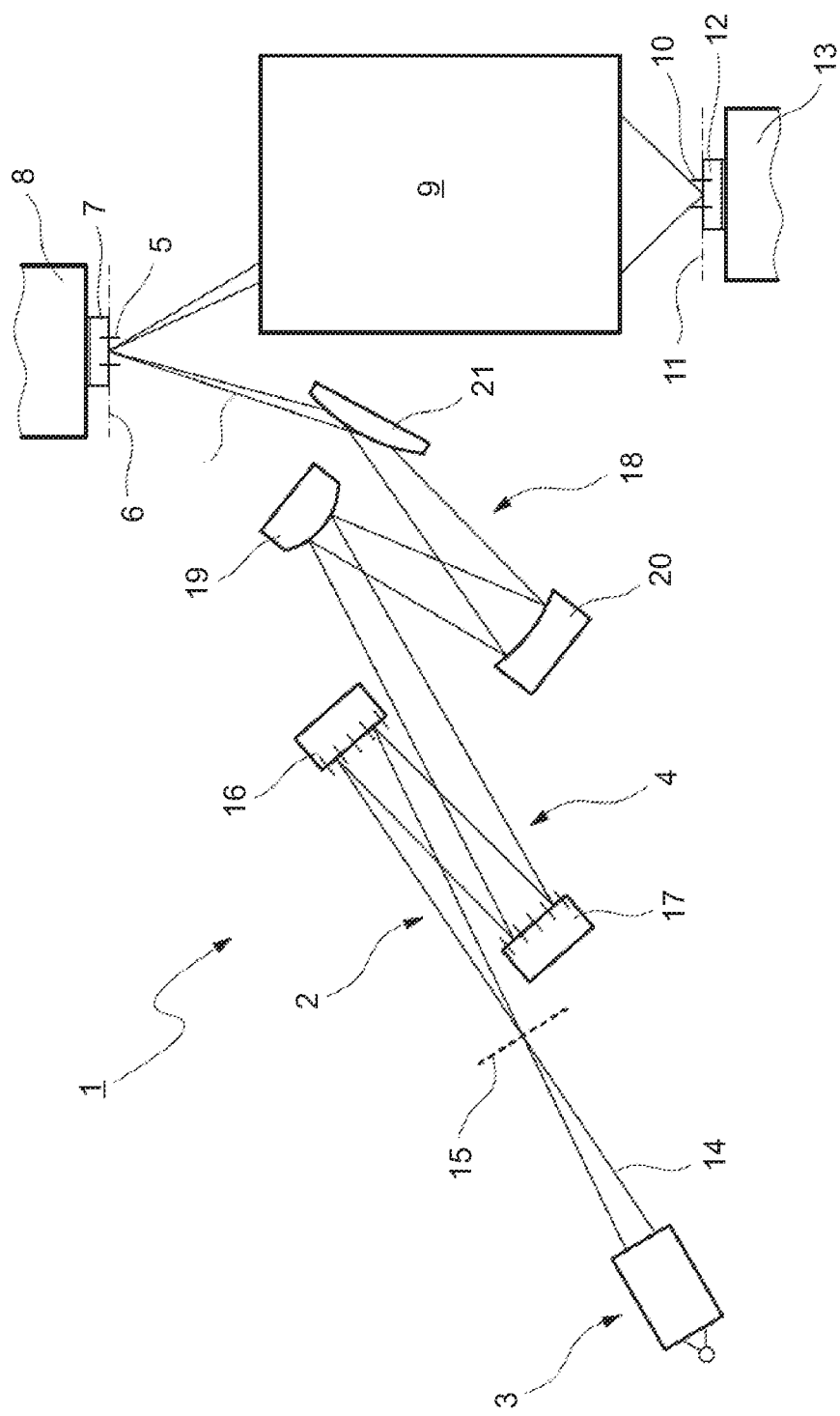
FIG. 1 shows by way of example the basic construction of an EUV projection exposure apparatus, in which the disclosure can find application.

FIG. 1 shows by way of example the basic construction of a microlithographic EUV projection exposure apparatus 1, in which the disclosure can find application. An illumination system 2 of the projection exposure apparatus 1 includes, besides a light source 3, an illumination optical unit 4 for the illumination of an object field 5 in an object plane 6. EUV radiation 14 generated in the form of optical used radiation via the light source 3 is aligned via a collector, which is integrated in the light source 3, in such a way that the radiation passes through an intermediate focus in the region of an intermediate focal plane 15 before it is incident on a field facet mirror 16. Downstream of the field facet mirror 16, the EUV radiation 14 is reflected by a pupil facet mirror 17. With the aid of the pupil facet mirror 17 and an optical assembly 18 having mirrors 19, 20 and 21, field facets of the field facet mirror 16 are imaged into the object field 5.

A reticle 7, which is arranged in the object field 5 and held by a schematically illustrated reticle holder 8, is illuminated. A projection optical unit 9, illustrated merely schematically, serves for imaging the object field 5 into an image field 10 into an image plane 11. A structure on the reticle 7 is imaged onto a light-sensitive layer of a wafer 12, which is arranged in the region of the image field 10 in the image plane 11 and is held by a wafer holder 13 that is likewise illustrated in part. The light source 3 can emit used radiation in particular in a wavelength range of between 5 nm and 30 nm.

Figure 2:
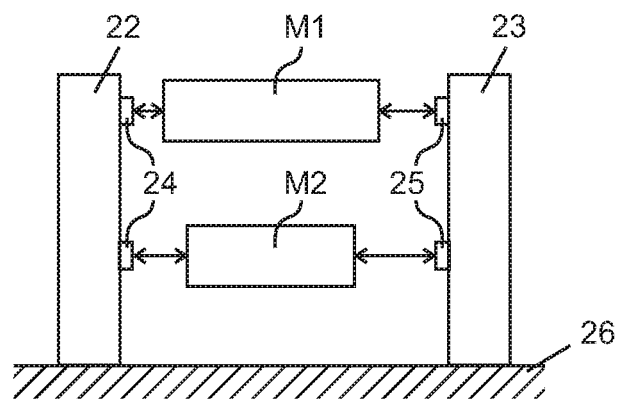
FIG. 2 schematically shows a first embodiment of the disclosure.

FIG. 2 shows, by way of example and schematically, a first embodiment of the disclosure, in which the two mirror's M1 and M2 are illustrated in part by way of example. M1 and M2 can here be mirrors of the projection optical unit 9 that is illustrated merely by way of example in FIG. 1. They can in particular be in the form of multilayer mirrors which are magnetically mounted on the other system components by way of actuators, which for clarity reasons are not illustrated in the figure, and can be controlled in terms of their position. Input variables for controlling and thus driving the Lorentz actuators can here be the relative positions of measurement points on the mirror M2 relative to reference points on the mirror M1, which serves as a position reference for the remaining mirrors in the projection optical unit 9 in FIG. 1. M1 is here generally the heaviest mirror in the projection optical unit, with the result that the total actuation effort for all mirrors in the projection optical unit can be kept as low as possible.

FIG. 2 furthermore shows the two substructures 22 and 23, which are respectively provided with sensors 24 and 25 for the position determination of reference or measurement points on the mirrors M1 and M2. The two substructures 22 and 23 are here arranged on the metro frame 26. The sensors 24 and 25 can be in particular optical encoders; the corresponding measurement distances are indicated in the figure by way of the non-designated double-headed arrows. FIG. 2 illustrates by way of example only in each case one sensor per substructure and mirror; however, it is of course possible for a plurality of sensors to be provided, in particular between 5 and 15 sensors, so that the position or the orientation of the mirrors M1 and M2 can be determined in all involved degrees of freedom. In particular, the substructures 22 and 23 can also include a plurality of segments (not illustrated in more detail in FIG. 2), which can be designed to be mechanically decoupled from one another. In accordance with the disclosure, the two substructures 22 and 23 differ with respect to their mechanical and thermal properties. Thus, the first substructure 22 is configured such that it has a lower coefficient of thermal expansion than the second substructure 23; conversely, the second substructure 23 is such that it is significantly stiffer than the first substructure 22. This can be achieved in particular by way of the first substructure 22 being made at least partially from Zerodur, while the second substructure 23 is made at least partially from aluminum or stainless steel. As a result, the sensors 24 of the first substructure 22 are suitable in particular for determining the orientation and position of the mirrors M1 and M2 on a long timescale. For determining position changes on a short timescale, as is the case in particular if oscillations occur, those sensors 25 that are arranged on the second, stiffer and thus less oscillation-susceptible substructure 23 can then be used.

Figure 3:
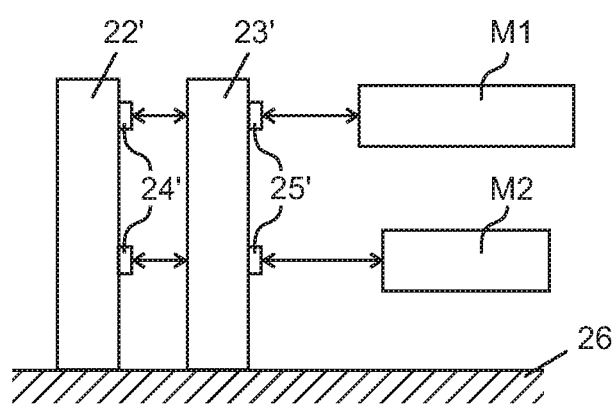
FIG. 3 shows a variant of the embodiment shown in FIG. 2.

FIG. 3 shows a variant, which is modified with respect to FIG. 2, to the effect that the sensors 24', which are arranged on the first substructure 22', no longer measure measurement or reference points on the mirrors M2 and M1. As compared to the solution shown in FIG. 2, the sensors arranged on the first substructure 22' in this case measure measurement points on the second substructure 23'. In this way, it is possible to obtain information relating to the extent to which a change in length or a deformation of the second substructure 23' has occurred due to thermal effects; in other words, direct monitoring of the second substructure 23' as regards its geometry is performed in real time. This makes it possible to correct the position data of the mirrors M1 and M2 that are ascertained by the sensors 25' on the second substructure 23' and thus to significantly increase the accuracy of the positioning of the mirrors used for example in the projection optical unit 9. In a variant of the disclosure that is not illustrated in any drawing it is of course also possible for the mirrors M1 and M2 to be measured directly using sensors 24' which are arranged on the first substructure 22', and for the sensors 25', which are arranged on the second substructure 23', to be used in particular for detecting oscillations of the first substructure 22'.

Overall it is possible by way of the disclosure to achieve a significant increase in the imaging quality of projection optical units. Especially what are known as overlay errors can be reduced here very considerably. Overlay errors are understood to mean an undesired offset of two structures which are produced on a wafer in different, temporally successive manufacturing steps. They are frequently the result of a thermal drift of the system components between the manufacturing steps. Due to the fact that this thermal drift can be measured using the above-described measures with greater reliability than has been previously known from the prior art, it is possible in particular to effectively counter the overlay problem.

LIST OF REFERENCE SIGNS 1 projection exposure apparatus
2 illumination system
3 light source
4 illumination optical unit
5 object field
6 object plane
7 reticle
8 reticle holder
9 projection optical unit
10 image field
11 image plane
12 wafer
13 wafer holder
14 used radiation, EUV radiation
15 intermediate focal plane
16 field facet mirror
17 pupil facet mirror
18 optical assembly
19 mirror
20 mirror
21 mirror
22, 22' first substructure
23, 23' second substructure
24, 24' sensors
25, 25' sensors
26 frame, metro frame
M1 mirror
M2 mirror

What is claimed is:
1. An apparatus, comprising:
a light source configured to generate optical used radiation by which structures arranged on a reticle are imagable onto a wafer;
a plurality of optical elements configured to guide and manipulate the used radiation; and a plurality of position sensors configured to determine a position of at least some of the optical elements,
wherein:
  at least some of the position sensors are arranged on a measurement structure that is at least partially decoupled mechanically and/or thermally from further components of the projection exposure apparatus;
  the measurement structure comprises first and second substructures that are mechanically decoupled from each other;
  a coefficient of thermal expansion of the first substructure is lower than a coefficient of thermal expansion of the second substructure;
  a stiffness of the second substructure is greater than a stiffness of the first substructure; and
  the apparatus is a semiconductor projection exposure apparatus.

2. The apparatus of claim 1, wherein a magnetostrictive constant of the first sub-structure is lower than a magnetostrictive constant of the second substructure.

3. The apparatus of claim 1, wherein at least sections of the first substructure comprise Zerodur.

4. The apparatus of claim 1, wherein at least sections of the second substructure comprise a material selected from the group consisting of aluminum and stainless steel.

5. The apparatus of claim 1, wherein at least some of the position sensors are arranged on the first substructure and are configured to determine the positions of reference points on the second substructure.

6. The apparatus of claim 1, wherein at least some of the position sensors are arranged on the second substructure and are configured to determine the positions of reference points on the first substructure.

7. The apparatus of claim 1, wherein at least some of the position sensors are arranged on both the first and second substructures and are configured to determine positions of reference points on at least one component of the projection exposure apparatus.

8. The apparatus of claim 7, wherein the at least one component comprises at least one optical element.

9. The apparatus of claim 7, wherein the at least one component comprises at least one mirror.

10. The apparatus of claim 1, wherein the first substructure comprises from three to five segments, each segment have assigned thereto from five to 15 measurement points.

11. The apparatus of claim 10, wherein the second substructure comprises from three to five segments, each segment have assigned thereto from five to 15 measurement points.

12. The apparatus of claim 1, wherein the second substructure comprises from three to five segments, each segment have assigned thereto from five to 15 measurement points.

13. The apparatus of claim 1, wherein the light source is configured to emit EUV radiation.

14. The apparatus of claim 1, wherein the first and second substructures are arranged on a common frame.

15. The apparatus of claim 1, wherein at least sections of the first substructure comprise Zerodur, and at least sections of the second substructure comprise a material selected from the group consisting of aluminum and stainless steel.

16. An apparatus, comprising:
a light source configured to generate EUV radiation by which structures arranged on a reticle are imagable onto a wafer;
a plurality of mirrors configured to guide and manipulate the EUV radiation; and
a plurality of position sensors configured to determine a position of at least some of the mirrors,
wherein:
  at least some of the position sensors are arranged on a measurement structure that is at least partially decoupled mechanically and/or thermally from further components of the projection exposure apparatus;
  the measurement structure comprises first and second substructures that are mechanically decoupled from each other;
  a coefficient of thermal expansion of the first substructure is lower than a coefficient of thermal expansion of the second substructure;
  a stiffness of the second substructure is greater than a stiffness of the first substructure; and
  the apparatus is a semiconductor projection exposure apparatus.

17. The apparatus of claim 16, wherein a magnetostrictive constant of the first substructure is lower than a magnetostrictive constant of the second substructure.

18. The apparatus of claim 16, wherein at least sections of the first substructure comprise Zerodur.

19. The apparatus of claim 16, wherein at least sections of the second substructure comprise a material selected from the group consisting of aluminum and stainless steel.

20. An apparatus, comprising:
a light source configured to generate EUV radiation by which structures arranged on a reticle are imagable onto a wafer;
a plurality of mirrors configured to guide and manipulate the EUV radiation; and
a plurality of position sensors configured to determine a position of at least some of the mirrors,
wherein:
  at least some of the position sensors are arranged on a measurement structure that is at least partially decoupled mechanically and/or thermally from further components of the projection exposure apparatus;
  the measurement structure comprises first and second substructures that are mechanically decoupled from each other;
  a coefficient of thermal expansion of the first substructure is lower than a coefficient of thermal expansion of the second substructure;
  a stiffness of the second substructure is greater than a stiffness of the first sub structure;
  at least sections of the first substructure comprise Zerodur;
  at least sections of the second substructure comprise a material selected from the group consisting of aluminum and stainless steel; and
  the apparatus is a semiconductor projection exposure apparatus.

* * * * *

UNITED STATES PATENT AND TRADEMARK OFFICE
CERTIFICATE OF CORRECTION

PATENT NO. : 10,466,598 B2
APPLICATION NO. : 16/368467
DATED : November 5, 2019
INVENTOR(S) : Alireza Akbarinia et al.

It is certified that error appears in the above-identified patent and that said Letters Patent is hereby corrected as shown below:

In the Specification

Column 3, Lines 4-5, delete "lows frequency" and insert -- low-frequency --.

Signed and Sealed this
Seventh Day of April, 2020

Andrei Iancu
*Director of the United States Patent and Trademark Office*